(12) United States Patent
Chen et al.

(10) Patent No.: US 11,523,505 B2
(45) Date of Patent: Dec. 6, 2022

(54) EMBEDDED COMPONENT STRUCTURE AND MANUFACTURING METHOD THEREOF

(71) Applicant: Unimicron Technology Corp., Taoyuan (TW)

(72) Inventors: Yu-Shen Chen, Taoyuan (TW); I-Ta Tsai, Kaohsiung (TW); Chien-Chih Chen, Taoyuan (TW)

(73) Assignee: Unimicron Technology Corp., Taoyuan (TW)

( * ) Notice: Subject to any disclaimer, the term of this patent is extended or adjusted under 35 U.S.C. 154(b) by 0 days.

(21) Appl. No.: 17/406,115

(22) Filed: Aug. 19, 2021

(65) Prior Publication Data

US 2022/0022317 A1 Jan. 20, 2022

Related U.S. Application Data

(62) Division of application No. 17/009,790, filed on Sep. 2, 2020, now Pat. No. 11,134,567.

(30) Foreign Application Priority Data

Jul. 15, 2020 (TW) .................................. 109123889

(51) Int. Cl.
| | | |
|---|---|---|
| *H05K 1/18* | (2006.01) | |
| *H05K 1/11* | (2006.01) | |
| *H05K 3/40* | (2006.01) | |
| *H05K 3/46* | (2006.01) | |

(52) U.S. Cl.
CPC ............. *H05K 1/116* (2013.01); *H05K 1/183* (2013.01); *H05K 3/4038* (2013.01); *H05K 3/4697* (2013.01)

(58) Field of Classification Search
CPC .... H05K 1/183; H05K 3/4038; H05K 3/4697; H05K 1/185; H05K 2203/1469
See application file for complete search history.

(56) References Cited

U.S. PATENT DOCUMENTS

| | | | | |
|---|---|---|---|---|
| 7,350,296 | B2 * | 4/2008 | Ryu | H05K 1/185 |
| | | | | 29/829 |
| 9,345,125 | B2 * | 5/2016 | Koyanagi | H05K 1/114 |
| 2007/0195511 | A1 * | 8/2007 | Imamura | H05K 1/186 |
| | | | | 361/761 |

* cited by examiner

*Primary Examiner* — Sherman Ng
(74) *Attorney, Agent, or Firm* — JCIPRNET

(57) ABSTRACT

An embedded component structure includes a circuit board, an electronic component, a first conductive terminal, and a second conductive terminal. The circuit board includes a first electrical connection layer and a second electrical connection layer. The electronic component is embedded in the circuit board and includes a first contact and a second contact. The first conductive terminal and the second conductive terminal respectively at least cover a part of top surfaces and side walls of the first contact and the second contact, and the first electrical connection layer and the second electrical connection layer are respectively electrically connected to the first contact and the second contact through the first conductive terminal and the second conductive terminal. A method for manufacturing an embedded component structure is also provided.

8 Claims, 22 Drawing Sheets

EMBEDDED COMPONENT STRUCTURE AND MANUFACTURING METHOD THEREOF

CROSS-REFERENCE TO RELATED APPLICATION

This application is a divisional application of U.S. application Ser. No. 17/009,790 filed on Sep. 2, 2020, now allowed, which claims the priority benefit of Taiwan application serial no. 109123889, filed on Jul. 15, 2020. The entirety of each of the above-mentioned patent applications is hereby incorporated by reference herein and made a part of this specification.

BACKGROUND OF THE DISCLOSURE

1. Field of the Disclosure

The disclosure relates to an electronic component and a manufacturing method thereof, and in particular, to an embedded component structure and a manufacturing method thereof.

2. Description of Related Art

In recent years, an electronic component is usually carried by using a circuit board in an electronic product. However, the electronic component configured on the circuit board may increase a carrying area. Therefore, how to design an embedded component has become a current key technology. Furthermore, in a general embedded component, a position at which a contact is electrically connected is usually designed above or below the electronic component. In this way, excessive loss is easily generated, thereby reducing quality of the electronic product.

SUMMARY OF THE DISCLOSURE

The disclosure provides an embedded component structure and a manufacturing method thereof, which may effectively improve quality of an electronic product, flexibility of wiring on a three-dimensional structure, yield, and reliability.

An embedded component structure of the disclosure includes a circuit board, an electronic component, a first conductive terminal, and a second conductive terminal. The circuit board includes a first electrical connection layer and a second electrical connection layer. The first electrical connection layer and the second electrical connection layer are misaligned. The electronic component is embedded in the circuit board. The electronic component includes a first contact and a second contact. The first contact is located on the same side as the first electrical connection layer. The second contact is located on the same side as the second electrical connection layer. The first conductive terminal at least covers a part of a top surface and a side wall of the first contact, and the first electrical connection layer is electrically connected to the first contact through the first conductive terminal. The second conductive terminal at least covers a part of a top surface and a side wall of the second contact, and the second electrical connection layer is electrically connected to the second contact through the second conductive terminal.

In an embodiment of the disclosure, the first conductive terminal is respectively in direct contact with the first contact and the first electrical connection layer. The second conductive terminal is respectively in direct contact with the second contact and the second electrical connection layer.

In an embodiment of the disclosure, the circuit board is a multilayer structure, and the first electrical connection layer and the second electrical connection layer are located at different layers of the circuit board.

In an embodiment of the disclosure, the first electrical connection layer and the second electrical connection layer are not aligned with each other.

In an embodiment of the disclosure, the first electrical connection layer and the second electrical connection layer are non-coplanar.

In an embodiment of the disclosure, the first electrical connection layer and the second electrical connection layer are arranged along a direction in which a cavity extends.

In an embodiment of the disclosure, another part of the first contact and the second contact is not covered by the first conductive terminal and the second conductive terminal.

In an embodiment of the disclosure, the electronic component includes a central region and contact regions on two sides of the central region. The first conductive terminal and the second conductive terminal respectively extend toward the central region.

In an embodiment of the disclosure, the first conductive terminal completely covers the top surface and the side wall of first contact. The second conductive terminal completely covers the top surface and the side wall of the second contact.

In an embodiment of the disclosure, the electronic component is a passive component.

A method for manufacturing an embedded component structure of the disclosure at least includes the following steps: providing a circuit board having a cavity, where the circuit board includes a plurality of electrical connection layers, and the plurality of electrical connection layers are misaligned with each other; disposing an electronic component in the cavity, where the electronic component includes a plurality of contacts exposed from the cavity; forming a dielectric layer to seal the electronic component; removing a first part of the dielectric layer to form a plurality of blind holes of a first dimension beside the plurality of contacts; removing a second part of the dielectric layer to expand the plurality of blind holes from the first dimension to a second dimension and at least expose a part of top surfaces and side walls of the plurality of contacts and the plurality of electrical connection layers; and forming a plurality of conductive terminals in the plurality of blind holes of the second dimension, where the plurality of electrical connection layers are electrically connected to the plurality of contacts through the plurality of conductive terminals.

In an embodiment of the disclosure, the circuit board includes a plurality of buried holes, and a ratio of a third dimension of the plurality of buried holes to the second dimension is between 1:0.25 and 1:4, or the second dimension is between 20 microns and 100 microns.

In an embodiment of the disclosure, when the first part of the dielectric layer is removed, the top surfaces and the side walls of the plurality of contacts and the plurality of electrical connection layers are not exposed.

In an embodiment of the disclosure, the first part of the dielectric layer is removed by performing a laser drill process, a plasma process, or a sandblasting process.

In an embodiment of the disclosure, the second part of the dielectric layer is removed by performing a plasma process and a desmear process.

In an embodiment of the disclosure, the electronic component is attached in the cavity by using an adhesive layer.

In an embodiment of the disclosure, the plurality of blind holes are elongated when viewed from above.

In an embodiment of the disclosure, a part of a second part of the dielectric layer is removed to expose a region between the plurality of contacts.

In an embodiment of the disclosure, the plurality of blind holes are horseshoe-shaped when viewed from above.

In an embodiment of the disclosure, there are a plurality of conductive material layers in the cavity, and the conductive material layers are located at the bottom of the cavity.

Based on the above, the embedded component structure of the disclosure improves the design of electrical connection positions of contacts in the electronic component, so that the conductive terminal may at least cover a part of the top surface and the side wall of the contacts, to avoid redundant loss and effectively improve quality of the electronic product. Furthermore, the electrical connection layers may be aligned through the foregoing design. Therefore, the embedded component structure of the disclosure may be arbitrarily connected to a circuit to be electrically connected to the contact in various layers/directions of the circuit board, thereby effectively improving wiring flexibility on a three-dimensional structure. In addition, in the disclosure, a manufacturing process in which the dielectric layer is removed in stages to expand the blind hole from the first dimension to the second dimension to expose a part of the contacts and the electrical connection layer may prevent yield and reliability from being reduced due to damage to the electronic component caused by direct impact (such as laser bombardment, and the like) on the contacts of the electronic component when the blind hole is formed at one time, thereby effectively improving the yield and reliability of the embedded component structure.

To make the foregoing features and advantages of the disclosure more comprehensible, a detailed description is made below with reference to the accompanying drawings by using embodiments.

DESCRIPTION OF THE EMBODIMENTS

Figure 1A:
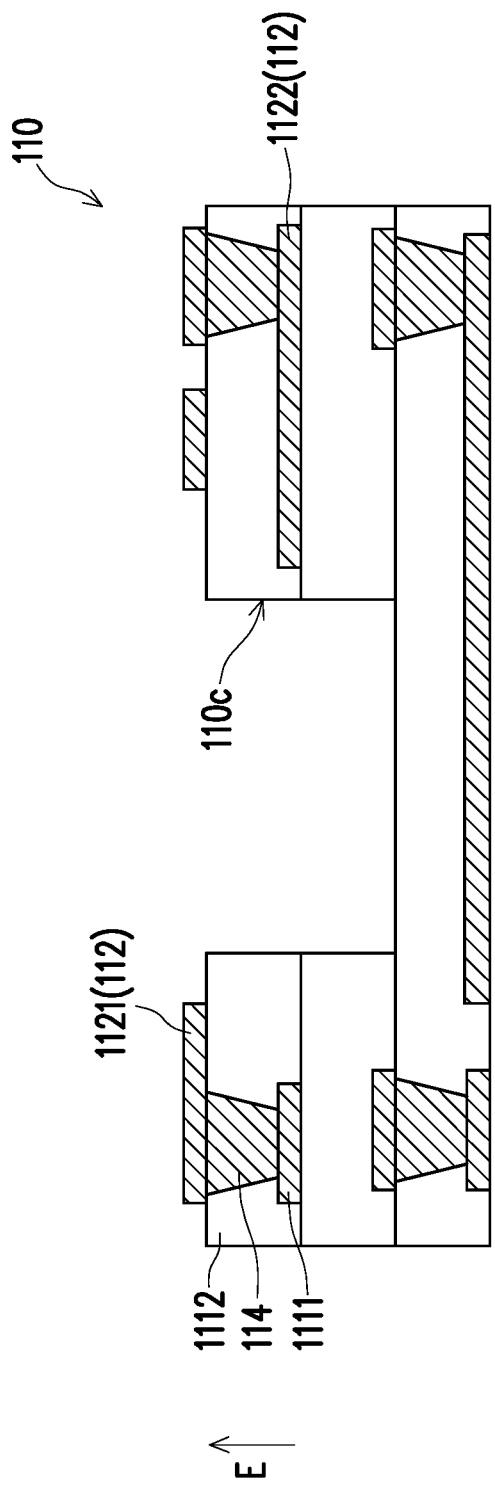
FIG. 1A to FIG. 1F is each a schematic cross-sectional diagram of a part of a method for manufacturing a part of an embedded component structure according to an embodiment of the disclosure.

The foregoing and other technical content, features, and effects of the disclosure can be clearly presented below in detailed description with reference to embodiments of the accompanying drawings. The directional terms mentioned herein, like "above", "below", "front", "back", "left", and "right", refer to the directions in the accompanying drawings. Therefore, the directional terms are only used for illustration instead of limiting the disclosure.

In the detailed description of the embodiments, the terms, like "first", "second", and "third", may be used for describing different elements. The terms are merely used for distinguishing between the elements, but these elements should not be limited by these terms in a structure. For example, a first element may be referred to as a second element, moreover, similarly, the second element may be referred to as the first element without departing from the protection scope of the ideas of the disclosure. In addition, in the manufacturing method, the formation sequence of the elements or components should also not be limited by these terms except specific manufacturing processes. For example, the first element may be formed before the second element, or the first element may be formed after the second element, or the first element and the second element may be formed in the same process or step.

In addition, the thickness of films and regions in the drawings may be enlarged for clarity. The same or similar reference numbers are used for representing the same or similar components, and details are not described below again.

FIG. 1A to FIG. 1F is each a schematic cross-sectional diagram of a part of a method for manufacturing a part of an embedded component structure according to an embodiment of the disclosure. FIG. 1G is a schematic top view of a region A of FIG. 1D. FIG. 1H is a schematic top view of a region B of FIG. 1E. FIG. 1I is a schematic top view of a region C of FIG. 1F. FIG. 1J is a three-dimensional schematic view of FIG. 1F. In the present embodiment, a process for manufacturing an embedded component structure 100 may include the following steps.

Referring to FIG. 1A, a circuit board 110 having a cavity 110c is provided. For example, the circuit board 110 may be formed by stacking a plurality of patterned conductive material layers 1111 and a plurality of dielectric material layers 1112, where the patterned conductive material layers 1111 may be electrically connected by using a plurality of buried holes 114. In addition, a part of the patterned conductive material layers 1111 may be used as a plurality of electrical connection layers 112 for subsequent electrical connection to contacts 122.

In the present embodiment, the circuit board 110 may include a plurality of electrical connection layers 112 that are misaligned. For example, the plurality of electrical connection layers 112 may include a first electrical connection layer 1121 and a second electrical connection layer 1122, and the first electrical connection layer 1121 and the second electrical connection layer 1122 may be misaligned. Herein, misaligned configuration means that the first electrical connection layer 1121 and the second electrical connection layer 1122 may not be aligned with each other. In other words, the first electrical connection layer 1121 and the second electrical connection layer 1122 may be non-coplanar.

In an embodiment, if the circuit board 110 is a multilayer structure, and the first electrical connection layer 1121 and the second electrical connection layer 1122 may be located at different layers of the circuit board 110. For example, the first electrical connection layer 1121 and the second electrical connection layer 1122 may be arranged along a direction E in which a cavity 110c extends, but the disclosure is not limited thereto. It should be noted that the method in which the first electrical connection layer 1121 and the second electrical connection layer 1122 are disposed in the disclosure is not limited to the method shown in FIG. 1A, that is, the direction and number of layers are not limited, as long as the first electrical connection layer 1121 and the second electrical connection layer 1122 are misaligned, which shall fall within the protection scope of the disclosure.

In addition, the cavity 110c may at least penetrate from the first electrical connection layer 1121 to the second electrical connection layer 1122. In other words, the first electrical connection layer 1121 and the second electrical connection layer 1122 may be located on two sides of the cavity 110c and separated from each other structurally and electrically.

Figure 1B:
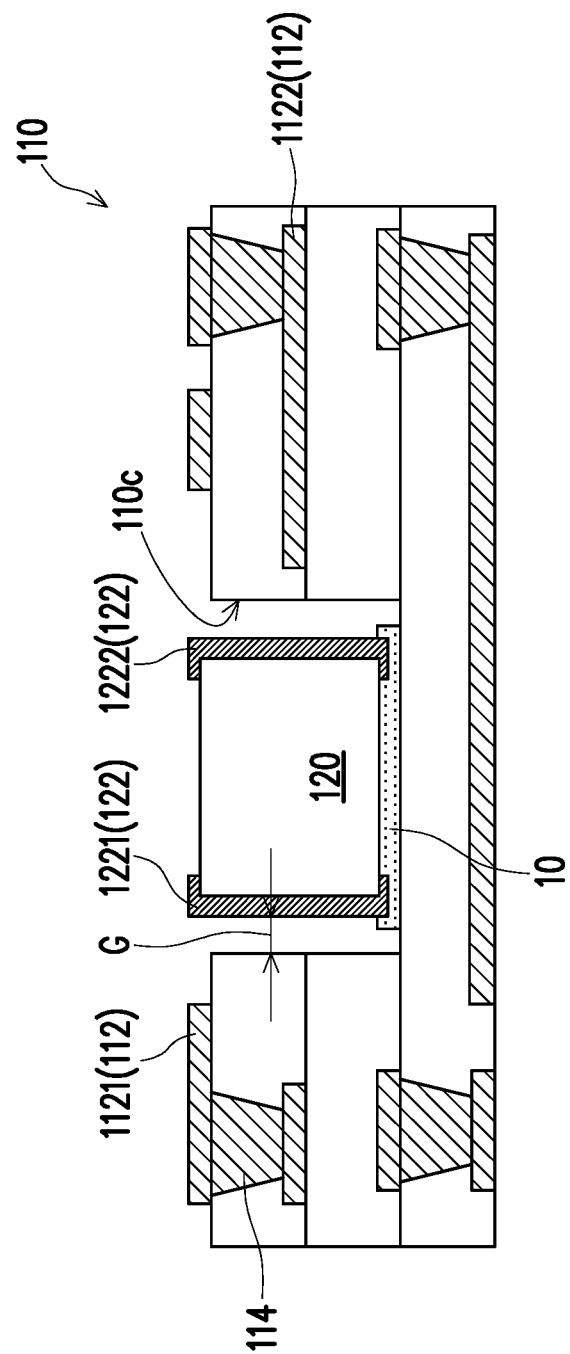

Referring to FIG. 1B, an electronic component 120 is disposed in the cavity 110c, where the electronic component 120 includes a plurality of contacts 122 exposed from the cavity 110c. Therefore, a subsequent electronic component 120 may be embedded in the circuit board 110. For example, the plurality of contacts 122 may include a first contact 1221 and a second contact 1222, where the first contact 1221 and the second contact 1222 may be located on two sides of the electronic component 120.

In the present embodiment, the first contact 1221 may be located on the same side of the electronic component 120 as the first electrical connection layer 1121, and the second contact 1222 may be located on the same side of the electronic component 120 as the second electrical connection layer 1122. Therefore, the first contact 1221 may be electrically connected to the first electrical connection layer 1121 subsequently, and the second contact 1222 may be electrically connected to the second electrical connection layer 1122 subsequently. Furthermore, the first contact 1221 and the first electrical connection layer 1121, and the second contact 1222 and the second electrical connection layer 1122 may be respectively located on opposite side walls of the electronic component 120.

In an embodiment, the electronic component 120 may be attached in the cavity 110c by using an adhesive layer 10, so that aging of an intermetallic compound (IMC) when the electronic component 120 is connected by using solder may be prevented from cracking, thereby effectively improving the yield and reliability of an embedded component structure 100. A material of the adhesive layer 10 is, for example, a photosensitive adhesive. However, the disclosure is not limited thereto, and the electronic component 120 may also be disposed in the cavity 110c in other suitable methods.

In an embodiment, the electronic component 120 is, for example, a passive component, such as a resistor, a capacitor, an inductor, a filter or the like, but the disclosure is not limited thereto, and a type of the electronic component 120 may be selected according to actual needs.

In an embodiment, there may be a gap G between the plurality of contacts 122 and a side wall of the cavity 110c. In other words, the plurality of contacts 122 of the electronic component 120 may not be in direct contact with the side wall of the cavity 110c, but the disclosure is not limited thereto.

Figure 1C:
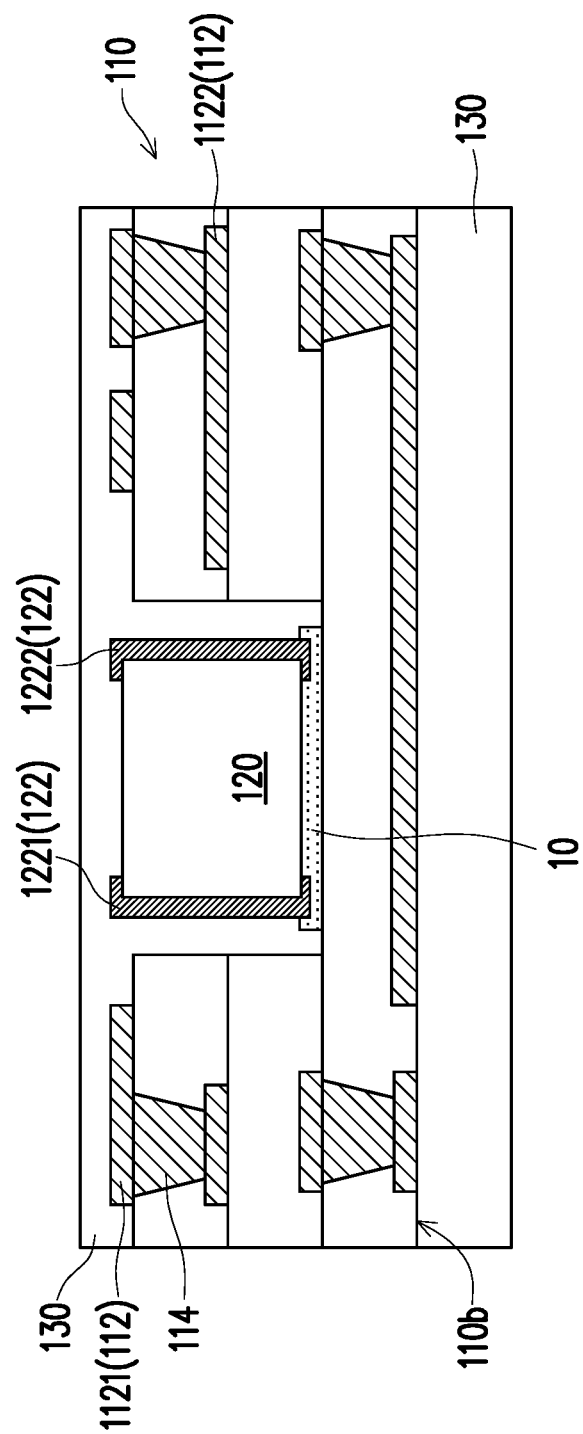

Referring to FIG. 1C, a dielectric layer 130 is formed to seal the electronic component 120. For example, the dielectric layer 130 may be filled in the cavity 110c and filled in the gap G (as shown in FIG. 1B) between the electronic component 120 and the circuit board 110. In addition, in an embodiment, the dielectric layer 130 may be further formed on a surface 110b of the circuit board 110 opposite to the cavity 110c, to serve as a subsequent build-up circuit.

In some embodiments, the dielectric layer 130 may be formed through a lamination process of resin (for example, epoxy or other similar thermosetting cross-linked resin), silane (for example, hexamethyldisiloxane (HMDSN), tetraethoxysilane (TEOS), bis (dimethylamino) dimethylsilane (BDMADMS)), or other suitable dielectric materials, but the disclosure is not limited thereto.

Figure 1D:
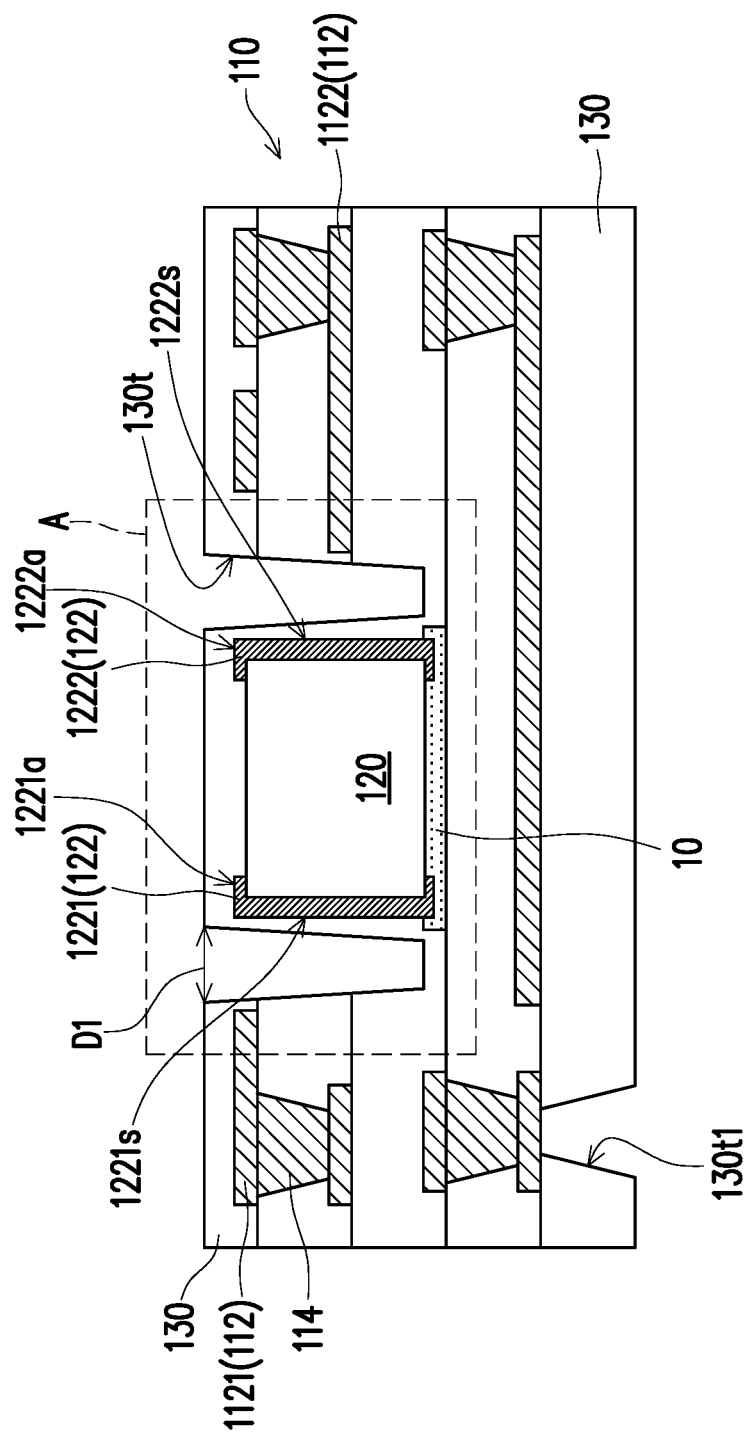
Figure 1E:
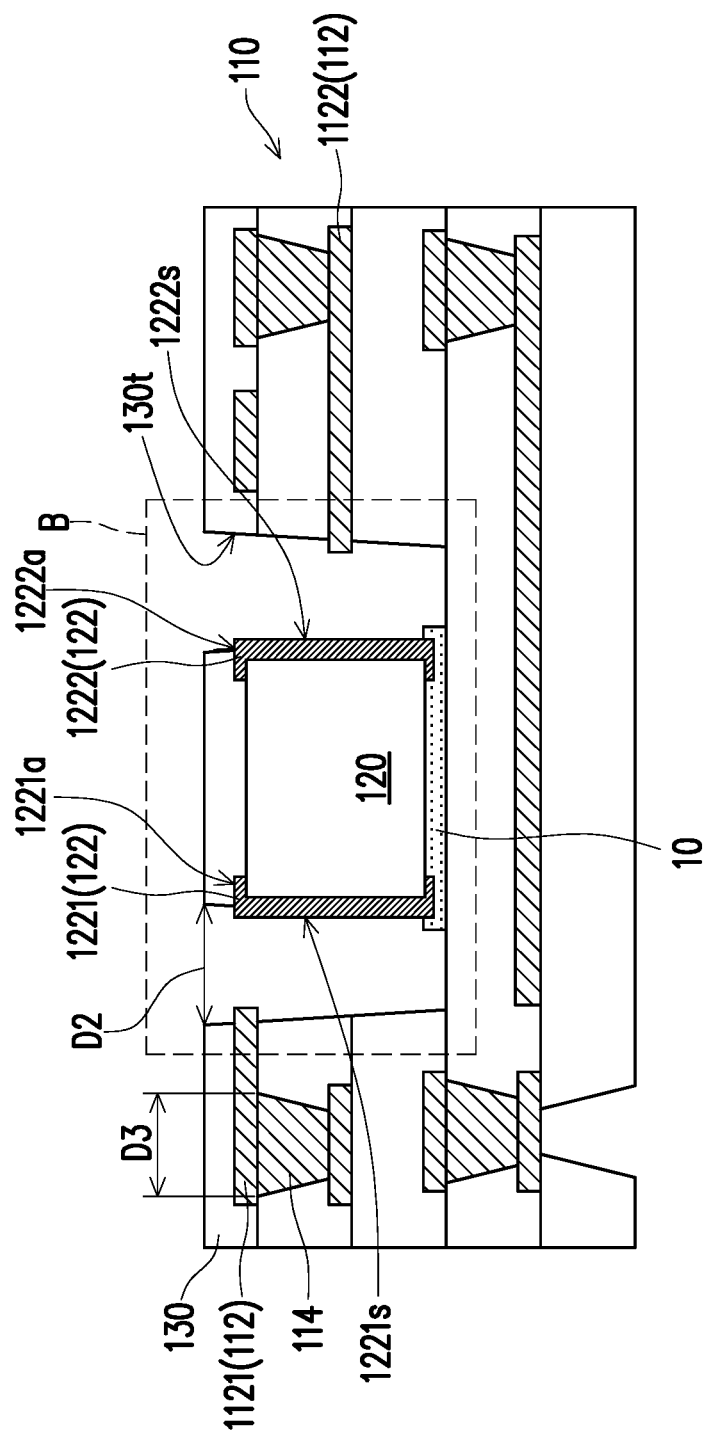

Referring to FIG. 1D, a first part of the dielectric layer 130 is removed to form a plurality of blind holes 130t of a first dimension D1 beside the plurality of contacts 122. Furthermore, for example, the first part of the dielectric layer 130 is removed by performing a laser drill process, a plasma process, or a sandblasting process. It should be noted that at this stage, when the first part of the dielectric layer 130 is removed, top surfaces and side walls of the plurality of contacts 122 and the plurality of electrical connection layers 112 may not be exposed, to effectively protect the contacts 122 and the electrical connection layers 112 of the electronic component 120. For example, a top surface 1221a and a side wall 1221s of a first contact 1221, a top surface 1222a and a side wall 1222s of a second contact 1222, a first electrical connection layer 1121, and a second electrical connection layer 1122 may not be exposed. In addition, based on circuit layout requirements, a part of the dielectric layer 130 located on the surface 110b of the circuit board 110 opposite to the cavity 110c may be selectively further removed, to form another blind hole 130t1, but the disclosure is not limited thereto.

In addition, in the present embodiment, as shown in FIG. 1G, the plurality of blind holes 130t are elongated when viewed above, but the disclosure is not limited thereto. In other embodiments, the plurality of blind holes 130t may be in other suitable shapes.

Referring to FIG. 1D to FIG. 1E and FIG. 1G to FIG. 1H together, a second part of the dielectric layer 130 is removed to expand the plurality of blind holes 130t from the first dimension D1 to a second dimension D2 and at least expose a part of top surfaces and side walls of the plurality of contacts 122 and the plurality of electrical connection layers 112. For example, at least a part of a top surface 1221a and a side wall 1221s of a first contact 1221, a top surface 1222a and a side wall 1222s of a second contact 1222, a first electrical connection layer 1121, and a second electrical connection layer 1122 may be exposed.

In the present embodiment, a manufacturing process in which the dielectric layer 130 is removed in stages to expand the blind holes 130t from the first dimension D1 to the second dimension D2 to expose a part of the contacts 122 and the electrical connection layer 112 may prevent yield and reliability from being reduced due to damage to the electronic component caused by direct impact (such as laser bombardment, and the like) on the contacts of the electronic component when the blind hole is formed at one time, thereby effectively improving the yield and reliability of the embedded component structure 100.

In some embodiments, a ratio of a third dimension D3 to the second dimension D2 of a plurality of buried holes 114 is between 1:0.25 and 1:4, or the second dimension D2 is between 20 microns and 100 microns, that is, the second dimension D2 of the blind hole 130t may be similar to the third dimension D3 of the buried hole 114, to reduce a volume occupied by the blind hole 130t in the embedded component structure 100 and improve a volume utilization rate in the embedded component structure 100, but the disclosure is not limited thereto. The second dimension D2 of the blind hole 130t may be determined according to actual design requirements.

It should be noted that the first dimension D1 and the second dimension D2 of the blind hole 130t and the dimension D3 of the buried hole 114 may be defined as a maximum width of the blind hole 130t and the buried hole 114.

In an embodiment, for example, the second part of the dielectric layer 130 is removed by performing a plasma process and a desmear process. Generally, when a blind hole is formed, a plasma process and a desmear process are usually used to remove residues in the hole. Therefore, in the present embodiment, no additional manufacturing process is required, and the blind hole 130t is expanded from the first dimension D1 to the second dimension D2 while removing the residue in the hole, so that the manufacturing process of the embedded component structure 100 may be effectively simplified, but the disclosure is not limited thereto.

Figure 1F:
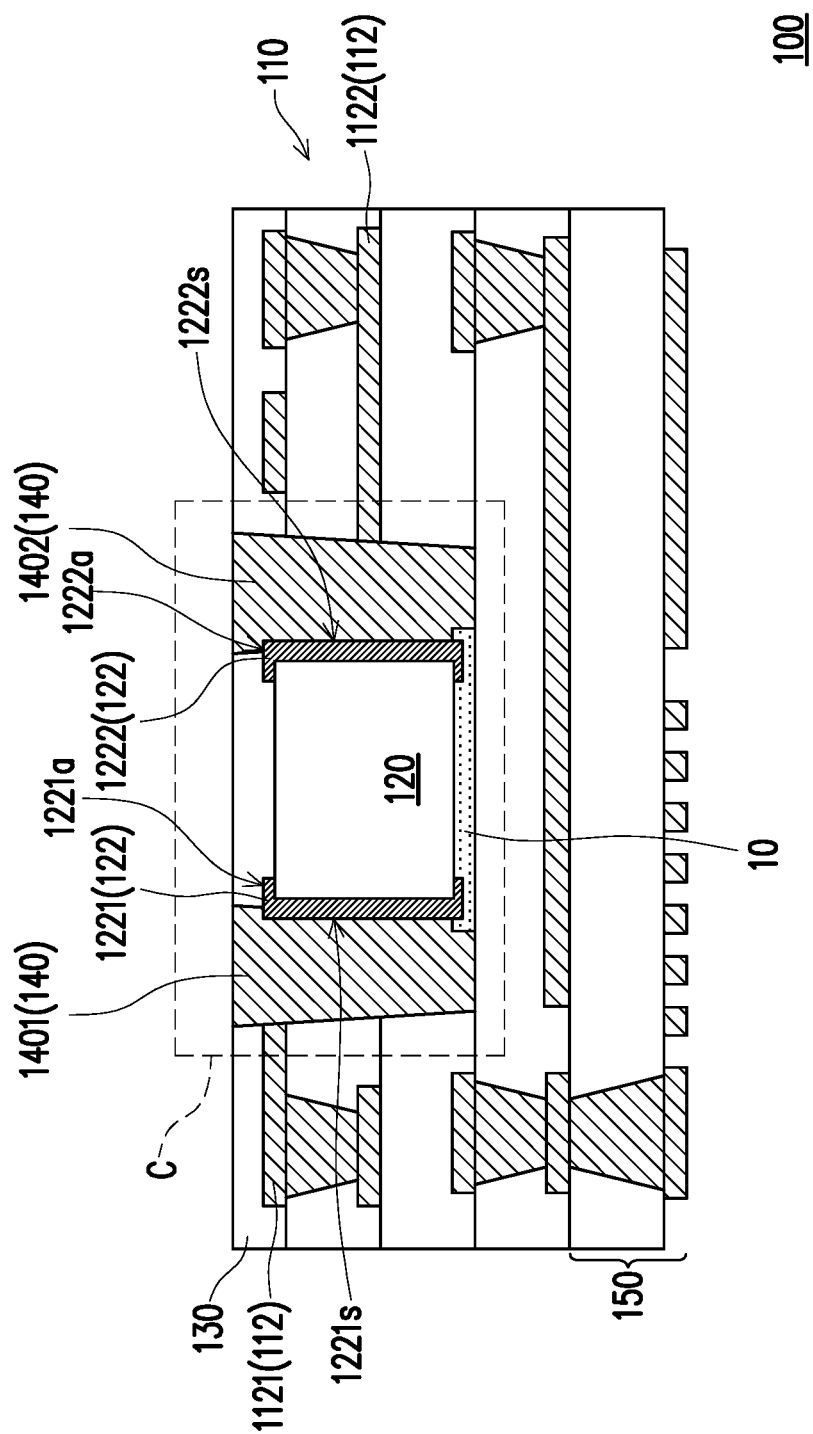
Figure 1G:
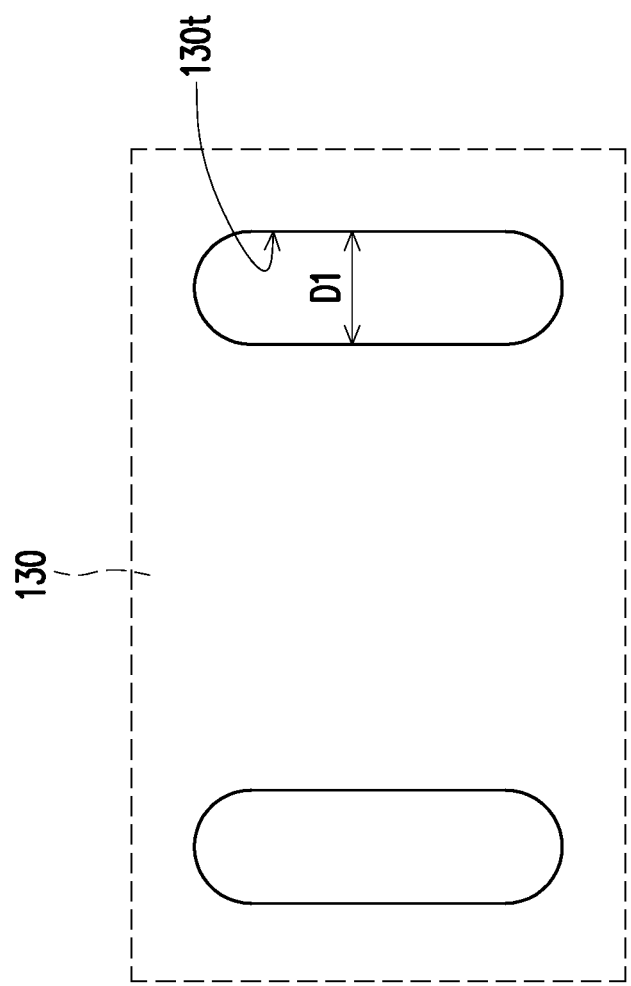
FIG. 1G is a schematic top view of a region A of FIG. 1D.
Figure 1H:
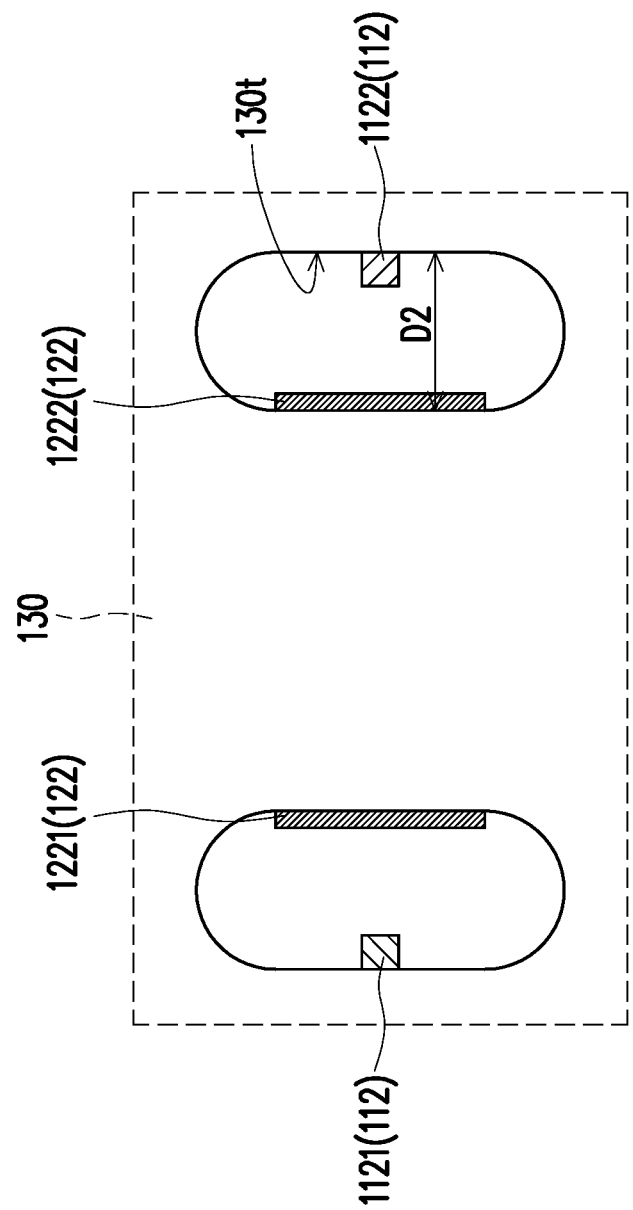
FIG. 1H is a schematic top view of a region B of FIG. 1E.
Figure 1I:
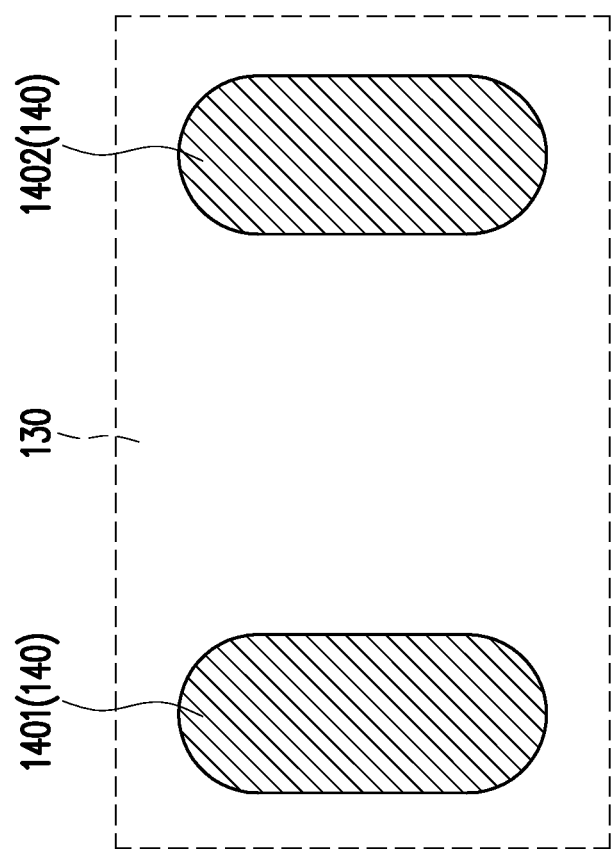
FIG. 1I is a schematic top view of a region C of FIG. 1F.
Figure 1J:
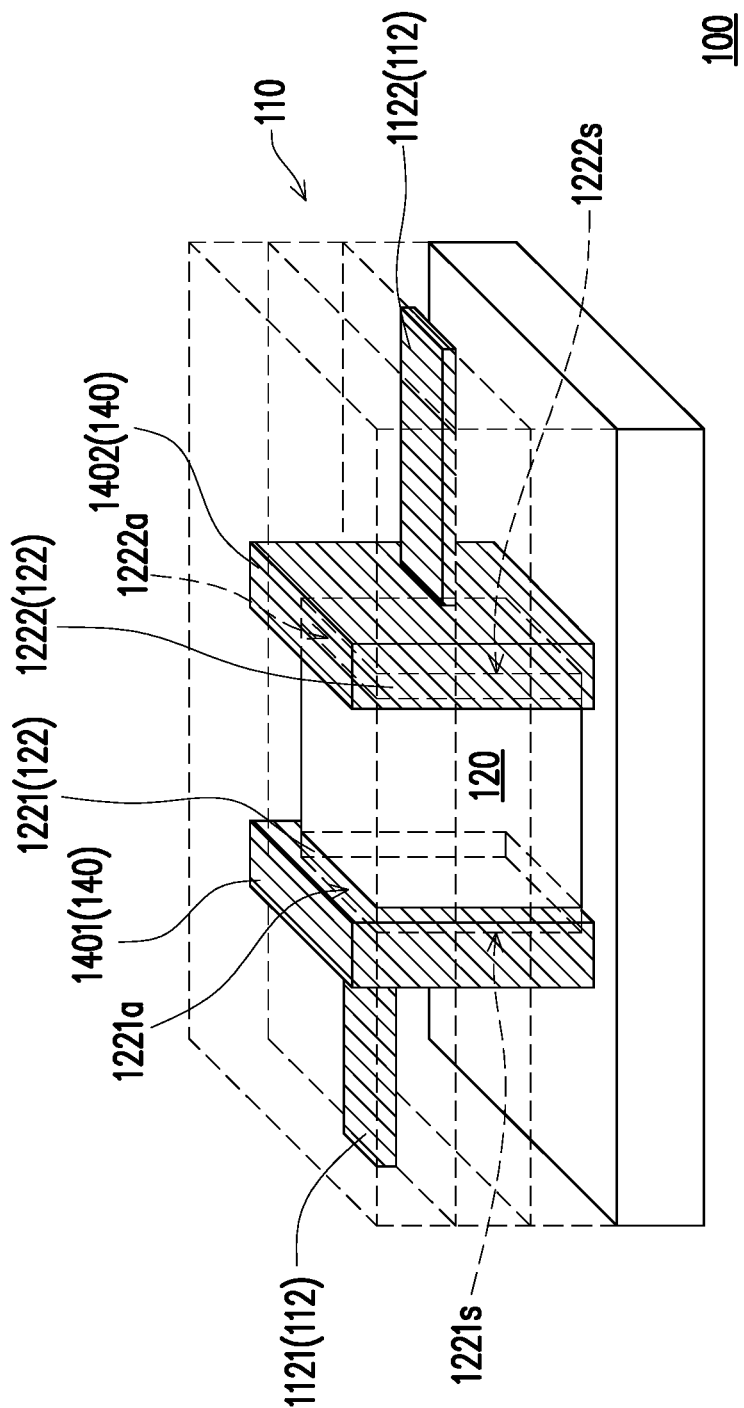
FIG. 1J is a three-dimensional schematic view of FIG. 1F.

Referring to FIG. 1F, FIG. 1I, and FIG. 1J together, a plurality of conductive terminals 140 are formed in a plurality of blind holes 130t of the second dimension D2, and a plurality of electrical connection layers 112 are electrically connected to a plurality of contacts 122 through the plurality of conductive terminals 140. For example, the plurality of conductive terminals 140 may include a first conductive terminal 1401 and a second conductive terminal 1402, where the first conductive terminal 1401 may cover at least a part of a top surface 1221a and a side wall 1221s of a first contact 1221, the first electrical connection layer 1121 is electrically connected to the first contact 1221 through the first conductive terminal 1401, the second conductive terminal 1402 may cover at least a part of a top surface 1222a and a side wall 1222s of a second contact 1222, and a second electrical connection layer 1122 is electrically connected to a second contact 1222 through the second conductive terminal 1402.

In the present embodiment, the embedded component structure 100 improves the design of electrical connection positions of contacts 122 in the electronic component 120, so that the conductive terminal 140 may cover at least a part of the top surface and the side wall of the contacts 122, to avoid redundant loss and effectively improve quality of the electronic product. Furthermore, the electrical connection layers 112 may be aligned through the foregoing design. Therefore, the embedded component structure 100 may be arbitrarily connected to a circuit to be electrically connected to the contact 122 in various layers/directions of the circuit board, thereby effectively improving wiring flexibility on a three-dimensional structure.

In addition, in the present embodiment, another part of the contacts 122 may not be covered by the conductive terminal 140. For example, another part of the first contact 1221 may not be covered by the first conductive terminal 1401, and another part of the second contact 1222 may not be covered by the second conductive terminal 1402. In other words, the first conductive terminal 1401 may not completely cover the top surface 1221a and the side wall 1221s of the first contact 1221, and the second conductive terminal 1402 may not completely cover the top surface 1222a and the side wall 1222s of the second contact 1222. Herein, it may be learned from FIG. 1F and FIG. 1J that the first conductive terminal 1401 does not completely cover the side wall 1221s of the first contact 1221, and the first conductive terminal 1401 completely covers only one of the side walls 1221s (such as the side wall 1221s on the left side) of the first contact 1221 without completely covering the other side walls 1221s (such as the side walls 1221s on front and back sides) connected thereto. However, the second conductive terminal 1402 does not completely cover the side walls 1222s of the second contact 1222, and the second conductive terminal 1402 completely covers only one of the side walls 1222s (such as the side wall 1222s on the right side) of the second contact 1222 without completely covering the other side walls 1222s (such as the side walls 1222s on front and back sides) connected thereto. However, the disclosure is not limited thereto. A degree in which the first contact 1221 and the second contact 1222 are covered may be determined depending on actual design requirements, as long as the conductive terminal 140 may cover at least a part of the top surface and the side wall of the contact 122, which shall fall within the protection scope of the disclosure.

In the present embodiment, the conductive terminal 140 may be respectively in direct contact with the contact 122 and the electrical connection layer 112, to form an electrode connection part. For example, the first conductive terminal 1401 may be respectively in direct contact with the first contact 1221 and the first electrical connection layer 1121, while the second conductive terminal 1402 may be respectively in direct contact with the second contact 1222 and the second electrical connection layer 1122, so that the first contact 1221, the first conductive terminal 1401, and the first electrical connection layer 1121 constitute a first electrode connection part, and the second contact 1222, the second conductive terminal 1402, and the second electrical connection layer 1122 constitute a second electrode connection part. In addition, a build-up circuit 150 may be further formed on the surface 110b of the circuit board 110 opposite to the cavity 110c, but the disclosure is not limited thereto.

Through the foregoing manufacturing process, the manufacturing of the embedded component structure 100 of the present embodiment may be substantially completed. An embedded component structure 100 of the present embodiment includes a circuit board 110, an electronic component 120, a first conductive terminal 1401, and a second conductive terminal 1402. The circuit board has a cavity 110c. The circuit board 110 includes a first electrical connection layer 1121 and a second electrical connection layer 1122. The first electrical connection layer 1121 and the second electrical connection layer 1122 are misaligned. The electronic component 120 is disposed in the cavity 110c. The electronic component 120 includes a first contact 1221 and a second contact 1222. The first contact 1221 is located on the same side as the first electrical connection layer 1121. The second contact 1222 is located on the same side as the second electrical connection layer 1122. The first conductive terminal 1401 covers at least a part of a top surface 1221a and a side wall 1221s of the first contact 1221, and the first electrical connection layer 1121 is electrically connected to the first contact 1221 through the first conductive terminal 1401. The second conductive terminal 1402 covers at least a part of a top surface 1222a and a side wall 1222s of the second contact 1222, and the second electrical connection layer 1122 is electrically connected to the second contact 1222 through the second conductive terminal 1402, so that quality of the electronic product, wiring flexibility on a three-dimensional structure, yield and reliability may be effectively improved.

Figure 2A:
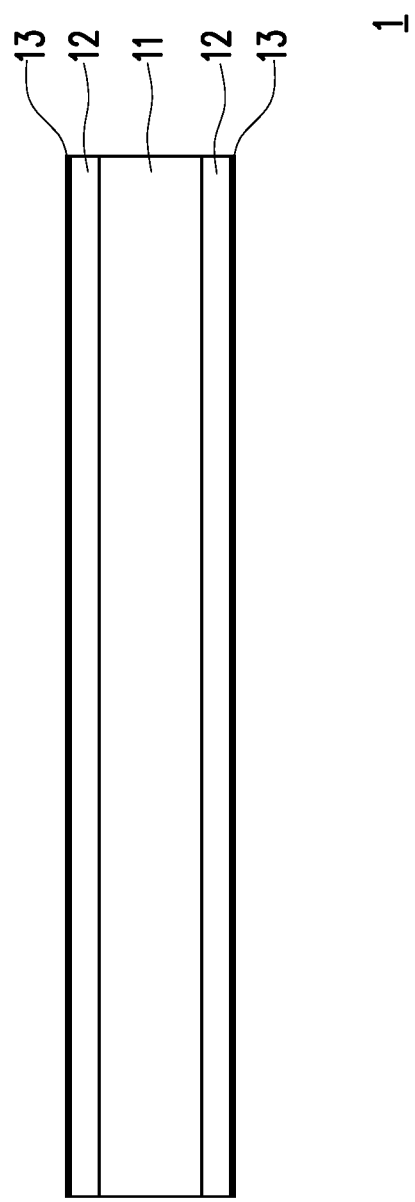
FIG. 2A to FIG. 2C are each a schematic cross-sectional diagram of a part of a manufacturing method of a circuit board of FIG. 1A.
Figure 2B:
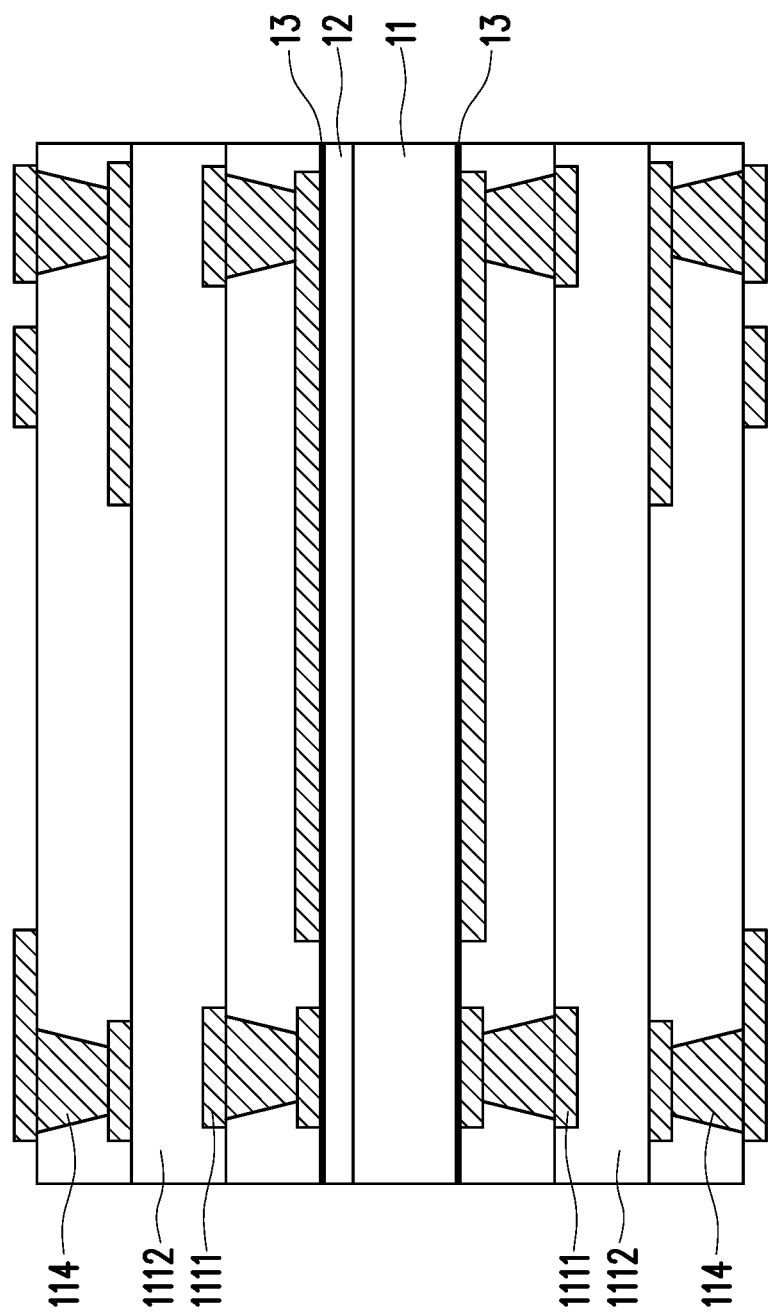
Figure 2C:
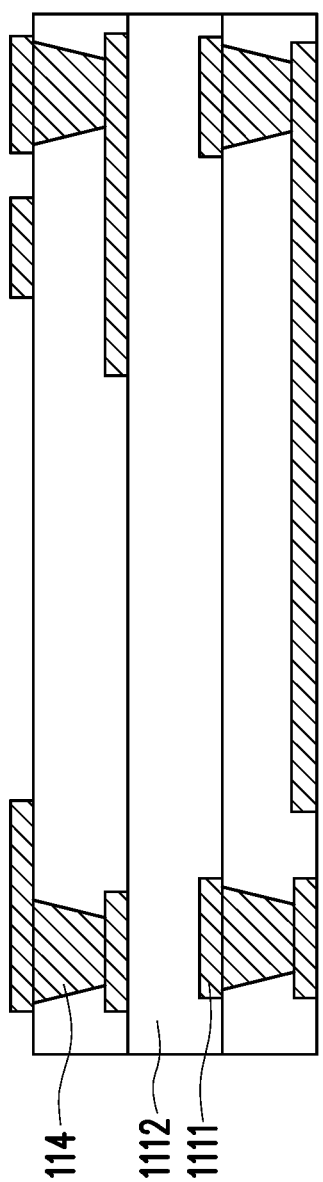

FIG. 2A to FIG. 2C are each a schematic cross-sectional diagram of a part of a manufacturing method of a circuit board of FIG. 1A.

Referring to FIG. 2A to FIG. 2C together, in an embodiment, for example, the circuit board 110 in FIG. 1A is formed by using the following steps.

First, as shown in FIG. 2A, a base 1 is provided, where the base 1 may include a core layer 11, a release layer 12, and a conductive material layer 13. The release layer 12 may be formed on the core layer 11, and the conductive material layer 13 may be formed on the release layer 12. For example, the release layer 12 and the conductive material layer 13 may be simultaneously formed on upper and lower surfaces of the core layer 11.

In some embodiments, the core layer 11 may include a polymer glass fiber composite substrate, a glass substrate, a ceramic substrate, an insulating silicon substrate, or a polyimide (PI) glass fiber composite substrate. However, the disclosure is not limited thereto, as long as the core layer 11 may be adapted to carry a film layer formed thereon or a component disposed thereon in the subsequent manufacturing process. In addition, the release layer 12 and the conductive material layer 13 may be made of any suitable release and conductive material.

Then, as shown in FIG. 2B and FIG. 2C, a plurality of patterned conductive material layers 1111 and a plurality of dielectric material layers 1112 are formed on the conductive material 13 on both sides, and then the core layer 11 and the release layer 12 are removed to form two circuit boards (only one is schematically shown in the figure). A plurality of buried holes 114 are formed between the plurality of patterned conductive material layers 1112, so that the plurality of patterned conductive material layers 1111 may be electrically connected. Herein, the patterned conductive material layer 1111, the dielectric material layer 1112, and the buried hole 114 may be formed by using suitable materials and methods, and the disclosure is not limited thereto.

Then, a cavity 110c may be formed in the dielectric material layer 1111 to form the circuit board 110 as shown in FIG. 1A. In one embodiment, for example, the core layer 11, the remaining release layer 12, and the conductive material layer 13 are removed by using an etching process, but the disclosure is not limited thereto.

It should be noted that the disclosure does not limit the method in which the circuit board 110 is formed, as long as the circuit board 110 has the cavity 110c, which shall fall within the protection scope of the disclosure.

FIG. 3A to FIG. 3D are each a schematic cross-sectional diagram of a part of a method for manufacturing a part of an embedded component structure according to an embodiment of the disclosure. FIG. 3E is a schematic top view of a region D of FIG. 3B. FIG. 3F is a schematic top view of a region E of FIG. 3C. FIG. 3G is a schematic top view of a region F of FIG. 3D. FIG. 3H is a three-dimensional schematic view of FIG. 3D.

Figure 3A:
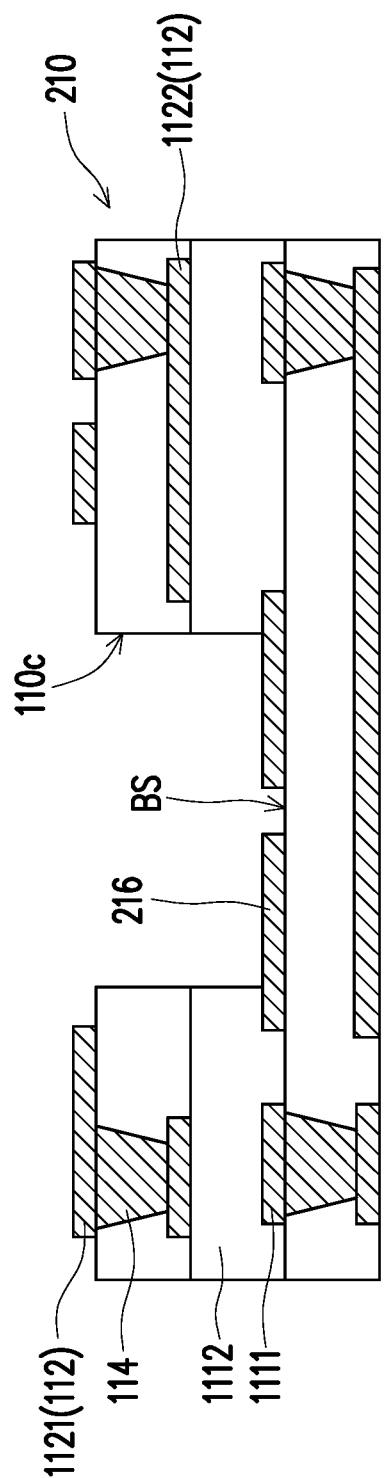
FIG. 3A to FIG. 3D are each a schematic cross-sectional diagram of a part of a method for manufacturing a part of an embedded component structure according to an embodiment of the disclosure.

Referring to FIG. 3A, similar to FIG. 1A, a difference is that a circuit board 210 may have a plurality of conductive material layers 216 in a cavity 110c, and the conductive material layers 216 may be located at a bottom BS of the cavity 110c. For example, the plurality of conductive material layers 216 may be a part of a patterned conductive material layer 1111 in the circuit board 210, but the disclosure is not limited thereto.

Figure 3B:
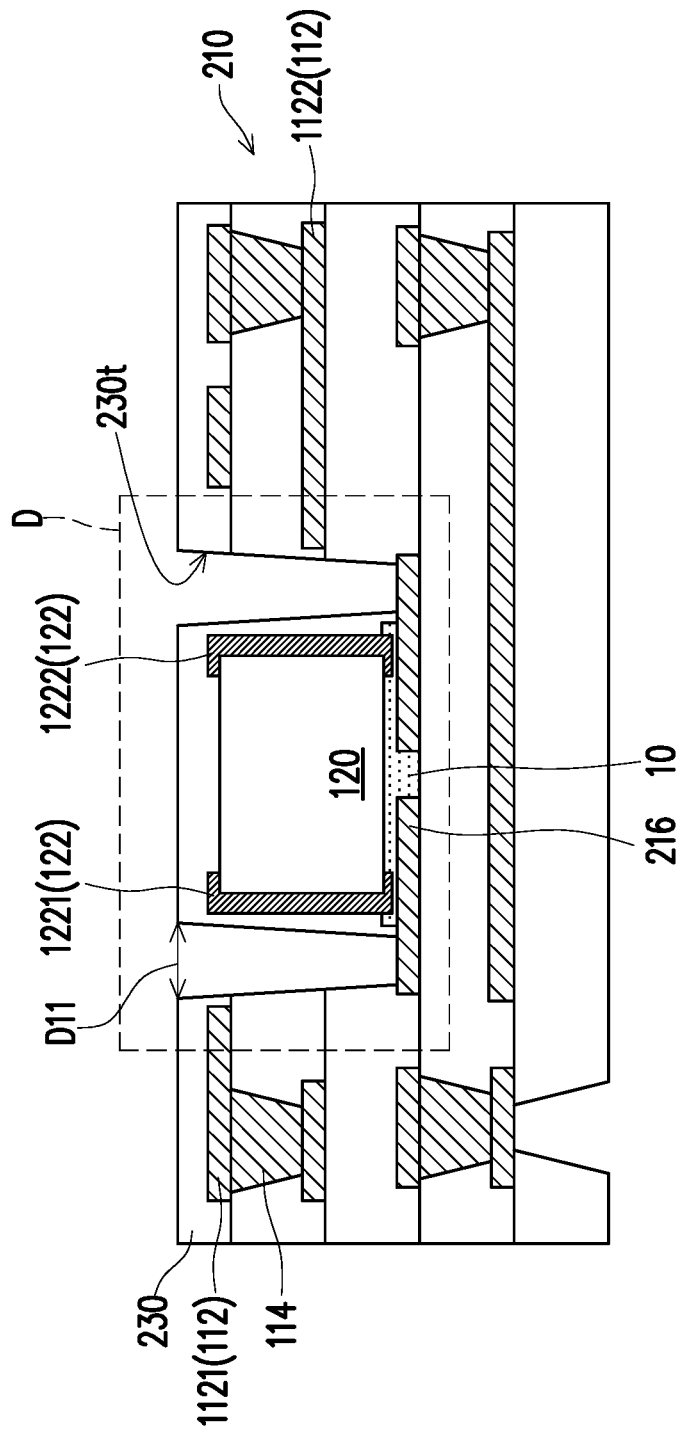
Figure 3C:
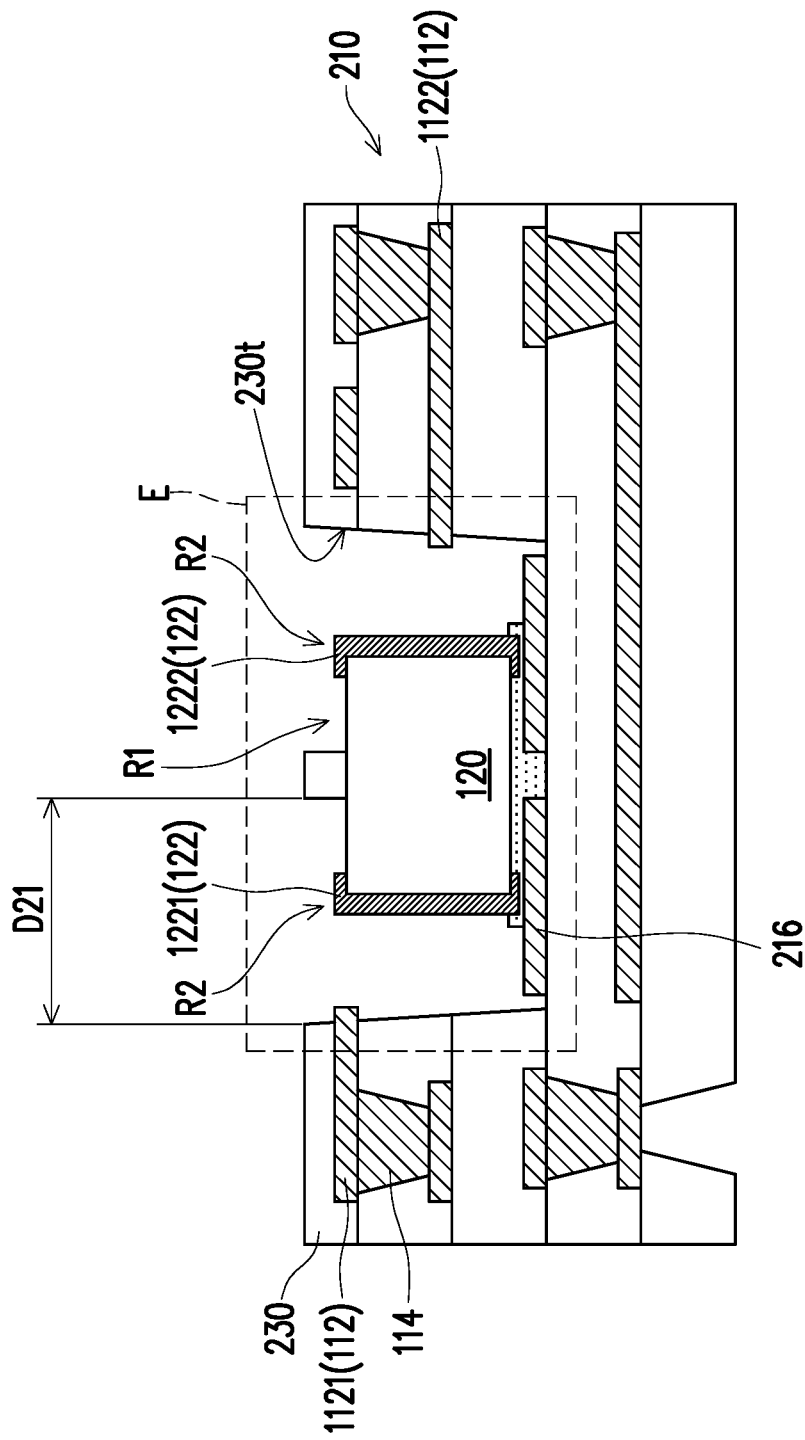
Figure 3D:
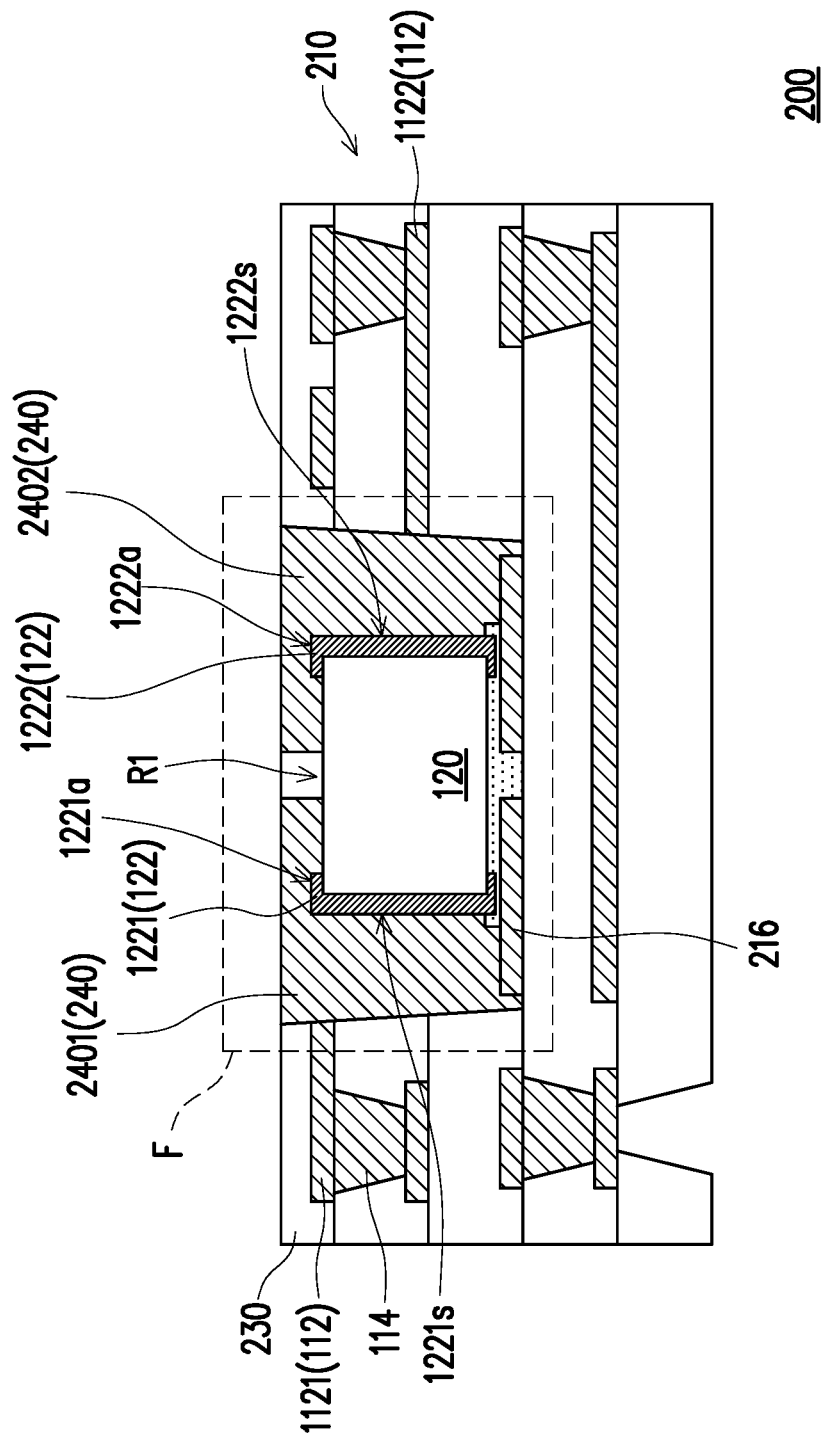
Figure 3E:
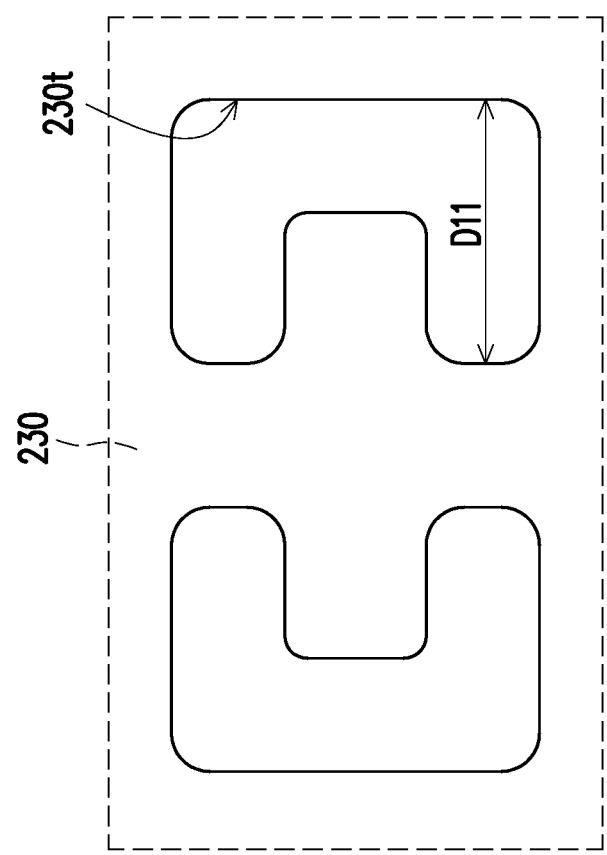
FIG. 3E is a schematic top view of a region D of FIG. 3B.
Figure 3F:
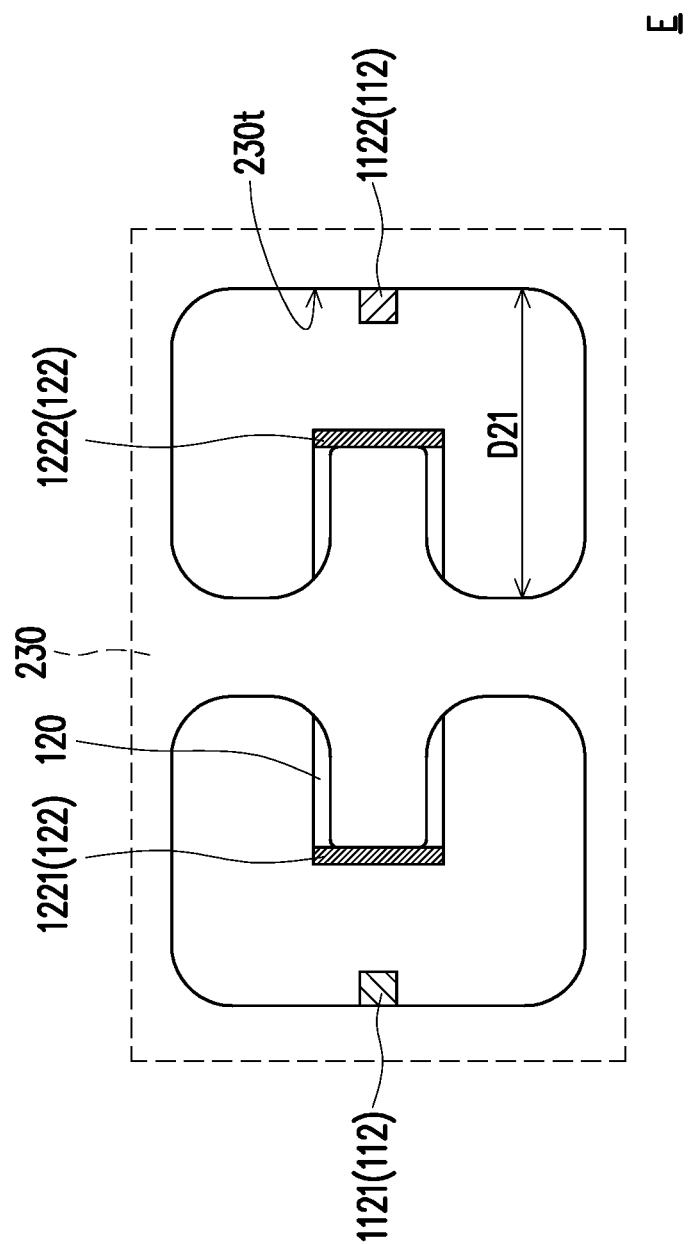
FIG. 3F is a schematic top view of a region E of FIG. 3C.
Figure 3G:
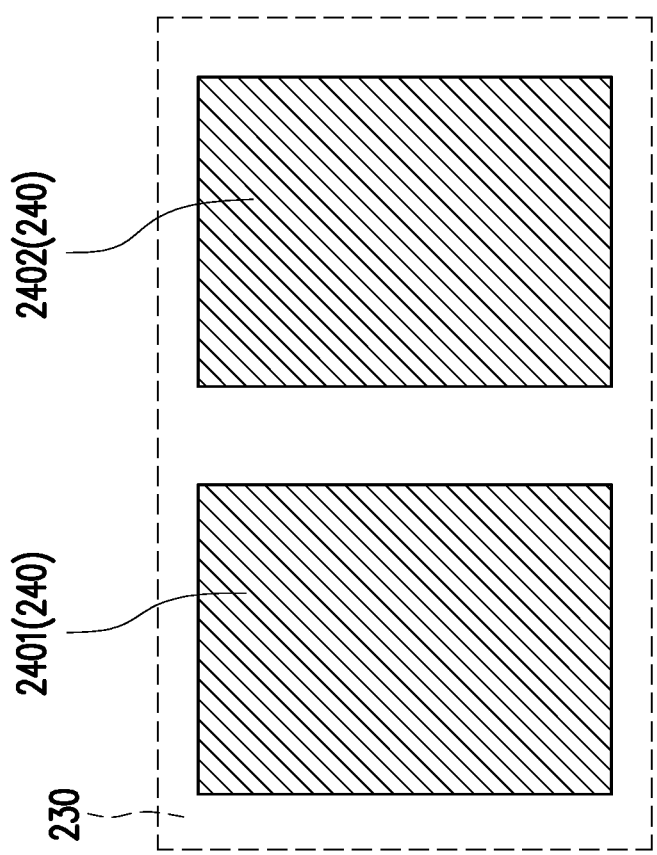
FIG. 3G is a schematic top view of a region F of FIG. 3D.
Figure 3H:
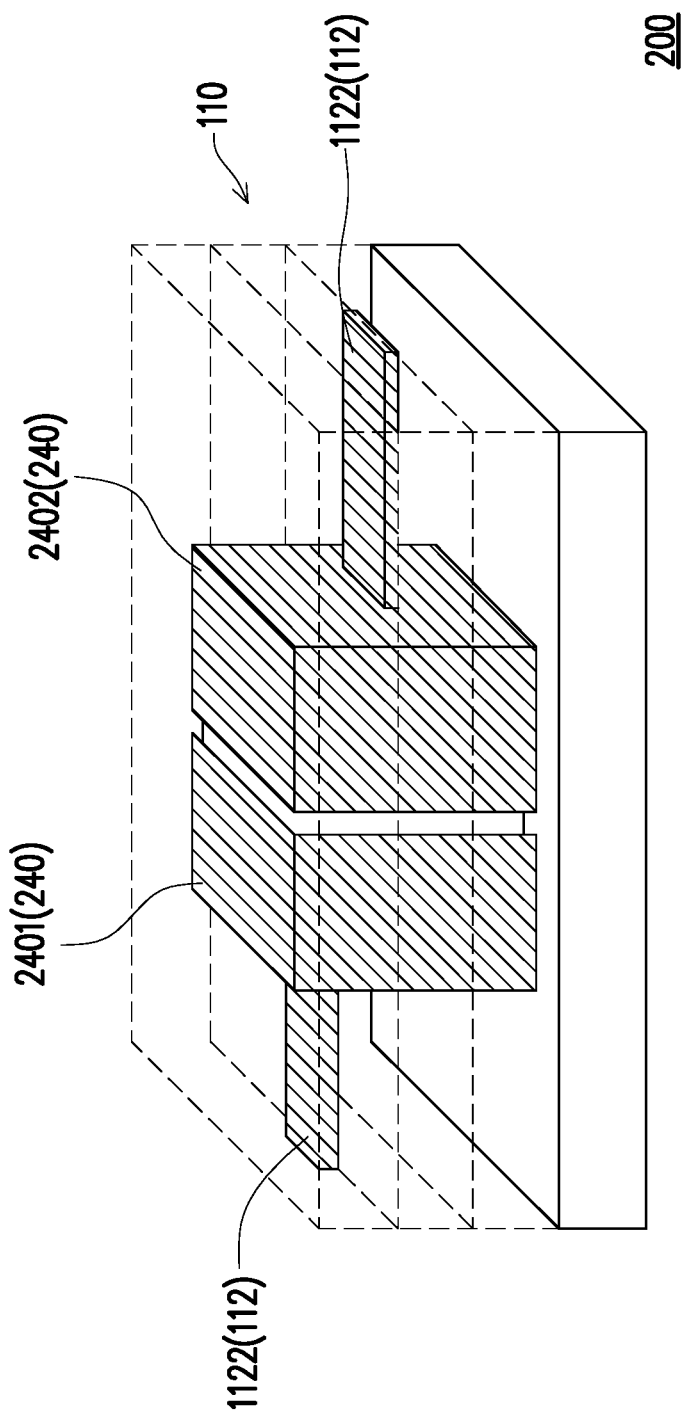
FIG. 3H is a three-dimensional schematic view of FIG. 3D.

Referring to FIG. 3B, similar to FIG. 1D, a difference is that after a first part of the dielectric layer 230 is removed, the plurality of blind holes 230t in the dielectric layer 230 are horseshoe-shaped when viewed from above, as shown in FIG. 3E, where the blind holes 230t may have a first dimension D11. In addition, the conductive material layer 216 below may be exposed from the blind hole 230t, so that the conductive terminal 240 formed in the blind hole 230t may extend from the conductive material layer 216, to further increase the degree in which the conductive terminal 240 covers the contact 122.

Referring to FIG. 3C, similar to FIG. 1E, a difference is that the second part of the dielectric layer 230 is removed to expand the plurality of blind holes 230t from the first dimension D11 to a second dimension D21 and expose a region between the plurality of contacts 122. In other words, the electronic component 120 may include a central region R1 and contact regions R2 on two sides of the central region R1, and the second part of the dielectric layer 230 is removed to completely expose the contact regions R2 and further expose a part of the central region R1. Furthermore, as shown in FIG. 3F, the horseshoe-shaped blind holes 230t may be equidistantly expanded, but the disclosure is not limited thereto.

Referring to FIG. 3D, FIG. 3G, and FIG. 3H together, a plurality of conductive terminals 240 are formed in a plurality of blind holes 230t of a second dimension D21, and a plurality of electrical connection layers 112 are electrically connected to a plurality of contacts 112 through the plurality of conductive terminals 240, where the conductive terminals 240 extend toward the central region R1. For example, a first conductive terminal 2401 and a second conductive terminal 2402 respectively extend toward the central region R1. In other words, the first conductive terminal 2401 may completely cover the top surface 1221a and the side wall 1221s of the first contact 1221, and the second conductive terminal 2402 may completely cover the top surface 1222a and the side wall 1222s of the second contact 1222. Therefore, the embedded component structure 200 in the present embodiment may further improve the wiring flexibility on the three-dimensional structure.

Figure 4:
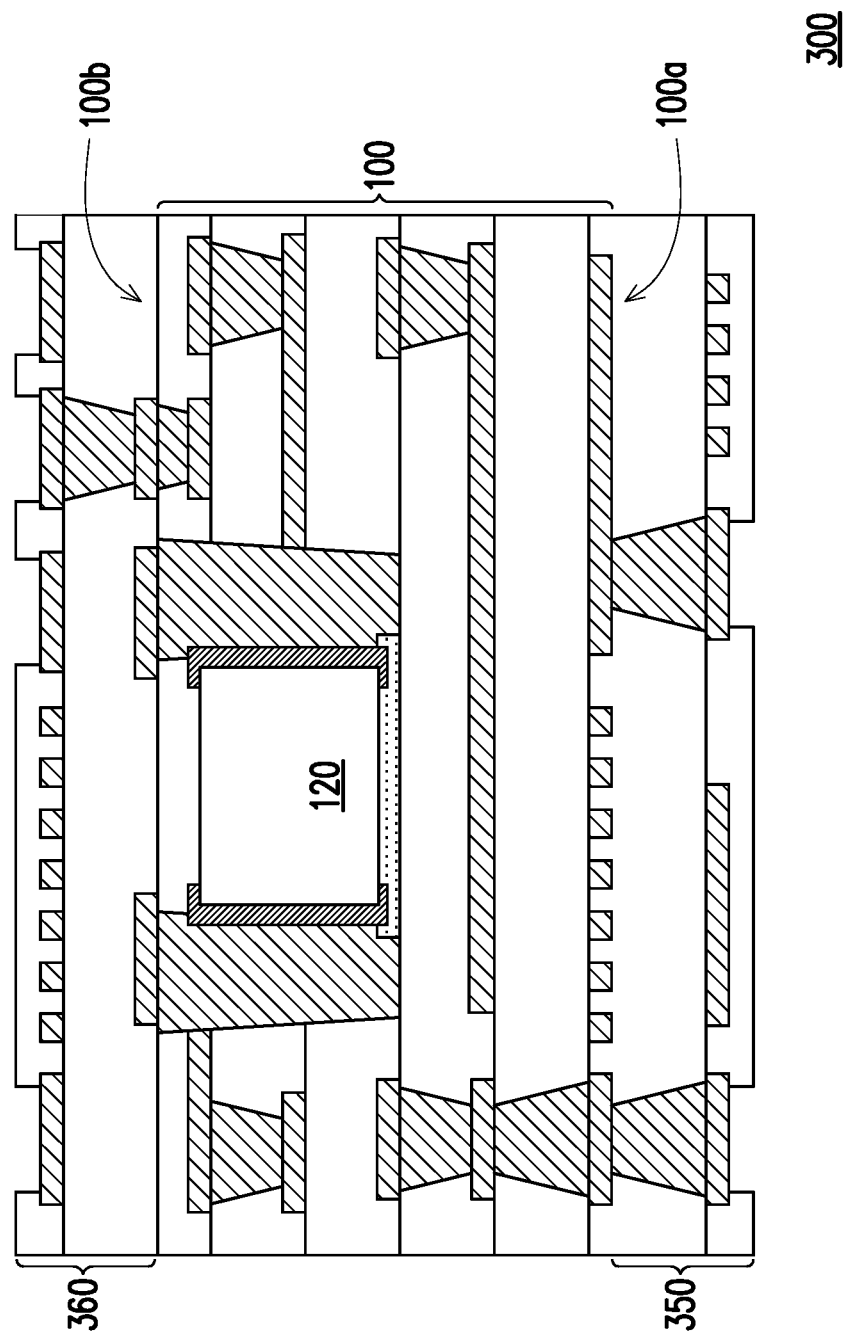
FIG. 4 is a schematic cross-sectional diagram of a part of an embedded component structure according to another embodiment of the disclosure.

FIG. 4 is a schematic cross-sectional diagram of a part of an embedded component structure according to another embodiment of the disclosure.

Referring to FIG. 4, similar to FIG. 1F, a difference is that the embedded component structure 300 of the present embodiment further forms a build-up circuit 350 on a first side 100a of the embedded component structure 100, and further forms a build-up circuit 360 on a second side 100b opposite to the first side 100a, so that the embedded component structure 300 may further perform other subsequent electrical connections.

Based on the above, the embedded component structure of the disclosure improves the design of electrical connection position of the contacts in the electronic component, so that the conductive terminal may cover at least a part of the top surface and the side wall of the contact, to avoid redundant loss and effectively improve quality of the electronic product. Furthermore, the electrical connection layers may be aligned through the foregoing design. Therefore, the embedded component structure of the disclosure may be arbitrarily connected to a circuit to be electrically connected to the contact in various layers/directions of the circuit board, thereby effectively improving wiring flexibility on a three-dimensional structure. In addition, in the disclosure, a manufacturing process in which the dielectric layer is removed in stages to expand the blind hole from the first dimension to the second dimension to expose a part of the contacts and the electrical connection layer may prevent yield from being reduced due to damage to the electronic component caused by direct impact (such as laser bombardment, and the like) on the contacts of the electronic component when the blind hole is formed at one time, thereby effectively improving the reliability of the embedded component structure.

Although the disclosure is disclosed above by using the embodiments, the embodiments are not used for limiting the disclosure. A person of ordinary skill in the art can make some equivalent variations and modifications without departing from the spirit and scope of the disclosure. Therefore, the protection scope of the disclosure should be subject to the appended claims.

What is claimed is:

1. An embedded component structure, comprising: a circuit board, comprising: a first electrical connection layer; and a second electrical connection layer, wherein the first electrical connection layer and the second electrical connection layer are misaligned; an electronic component embedded in the circuit board, wherein the electronic component comprises: a first contact located on the same side as the first electrical connection layer; and a second contact located on the same side as the second electrical connection layer; a first conductive terminal covering at least a part of a top surface and a side wall of the first contact, wherein the first electrical connection layer is electrically connected to the first contact through the first conductive terminal; and a second conductive terminal covering at least a part of a top surface and a side wall of the second contact, wherein the second electrical connection layer is electrically connected to the second contact through the second conductive terminal, wherein the electronic component comprises a central region and contact regions on two sides of the central region; and the first conductive terminal and the second conductive terminal respectively extend toward the central region, and wherein the first conductive terminal completely covers the top surface and the side wall of the first contact; and the second conductive terminal completely covers the top surface and the side wall of the second contact.

2. The embedded component structure according to claim 1, wherein the first conductive terminal is respectively in direct contact with the first contact and the first electrical connection layer; and the second conductive terminal is respectively in direct contact with the second contact and the second electrical connection layer.

3. The embedded component structure according to claim 1, wherein the circuit board is a multilayer structure, and the first electrical connection layer and the second electrical connection layer are located at different layers of the circuit board.

4. The embedded component structure according to claim 1, wherein the first electrical connection layer and the second electrical connection layer are not aligned with each other.

5. The embedded component structure according to claim 1, wherein the first electrical connection layer and the second electrical connection layer are non-coplanar.

6. The embedded component structure according to claim 1, wherein the first electrical connection layer and the second electrical connection layer are arranged along a direction in which a cavity extends.

7. The embedded component structure according to claim 1, wherein another part of the first contact and the second contact is not covered by the first conductive terminal and the second conductive terminal.

8. The embedded component structure according to claim 1, wherein the electronic component is a passive component.

* * * * *